(12) United States Patent
Doyle

(10) Patent No.: US 7,501,676 B2
(45) Date of Patent: Mar. 10, 2009

(54) HIGH DENSITY SEMICONDUCTOR MEMORY

(75) Inventor: Daniel H. Doyle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/089,890

(22) Filed: Mar. 25, 2005

(65) Prior Publication Data

US 2006/0214209 A1 Sep. 28, 2006

(51) Int. Cl.
*H01L 27/108* (2006.01)
*H01L 29/94* (2006.01)

(52) U.S. Cl. .............. 257/300; 257/296; 257/301; 257/303; 257/306; 257/E27.084; 257/E27.085; 257/E27.086; 257/E27.092

(58) Field of Classification Search ............. None
See application file for complete search history.

(56) References Cited

U.S. PATENT DOCUMENTS

| | | | | |
|---|---|---|---|---|
| 4,651,183 A | * | 3/1987 | Lange et al. | 257/296 |
| 4,763,178 A | * | 8/1988 | Sakui et al. | 257/296 |
| 5,223,730 A | | 6/1993 | Rhodes et al. | |
| 5,250,831 A | * | 10/1993 | Ishii | 257/354 |
| 5,270,241 A | | 12/1993 | Dennison et al. | |
| 5,324,975 A | | 6/1994 | Kumagai et al. | |
| 6,072,209 A | | 6/2000 | Noble et al. | |
| 6,188,095 B1 | * | 2/2001 | Hieke | 257/296 |
| 6,204,114 B1 | | 3/2001 | Clampitt et al. | |
| 6,239,500 B1 | * | 5/2001 | Sugimachi | 257/203 |
| 6,243,311 B1 | | 6/2001 | Keeth | |
| 6,282,116 B1 | * | 8/2001 | Kunkel et al. | 365/149 |
| 6,404,008 B1 | | 6/2002 | Prall | |
| 6,465,298 B2 | | 10/2002 | Forbes et al. | |
| 6,649,962 B2 | | 11/2003 | Tran | |
| 6,735,132 B2 | | 5/2004 | Siek | |
| 2004/0046213 A1 | * | 3/2004 | Hanzawa et al. | 257/390 |
| 2004/0062069 A1 | | 4/2004 | Keeth | |
| 2006/0202250 A1 | * | 9/2006 | Hecht et al. | 257/306 |

FOREIGN PATENT DOCUMENTS

JP 404192462 A * 7/1992

OTHER PUBLICATIONS

Beech et al., "Low Power 256K MRAM Design," 2002 Non-Volatile Memory Technology Symposium, Nov. 4-6, 2002, Honolulu, Hawaii, (6 pages).

* cited by examiner

*Primary Examiner*—Andy Huynh
*Assistant Examiner*—Hoang-Quan T Ho
(74) *Attorney, Agent, or Firm*—TraskBritt

(57) ABSTRACT

A memory cell, array and device include cross-shaped active areas and polysilicon gate areas disposed over arm portions of adjacent cross-shaped active areas. The polysilicon gate areas couple word lines with capacitors associated with each arm portion of the cross-shaped active areas. Buried digit lines are coupled to body portions of the cross-shaped active areas. The word lines and digit lines provide a unique contact to each capacitor of the array of memory cells. Each memory cell has an area of $5F^2$. An electronic system and method for fabricating a memory cell are also disclosed.

44 Claims, 12 Drawing Sheets

HIGH DENSITY SEMICONDUCTOR MEMORY

BACKGROUND OF THE INVENTION

1. Field of the Invention

The present invention relates to semiconductor memories in general and, more particularly, to an improved dynamic random access memory (DRAM) and method for making such a DRAM wherein a cross-shaped active area enables cells of the DRAM to be packed more densely, reducing memory cell size.

2. Background of Related Art

Random access memory ("RAM") cell densities have increased dramatically with each generation of new designs and have served as one of the principal technology drivers for ultra large scale integration ("ULSI") in integrated circuit ("IC") manufacturing. However, in order to accommodate continuing consumer demand for integrated circuits that perform the same or additional functions and yet have a reduced size as compared with available circuits, circuit designers continually search for ways to reduce the physical size of the memory arrays within these circuits without sacrificing array performance.

While device density is, of course, limited by the resolution capability of available photolithographic equipment, it is also limited by the configuration of the individual memory cells used to make the memory ICs, and the corresponding areas of the memory cells. Conventional memory device arrays include word lines running generally in parallel along one direction and bit line pairs running generally in parallel along a perpendicular direction. The memory cell includes a charge storage structure connected by a transistor to a bit line contact of one of the bit line pairs. Each transistor is activated by a word line. A row of memory cells is selected upon activation of a word line. The state of each memory cell in the row is transferred to a bit line for sensing by sense amplifiers, each of which is connected to a pair of bit lines. The memory cell transfer transistors are formed in the substrate in a plurality of continuous active areas running generally in parallel to each other. A word line forms the gate of the transistor. The transistor formed in the active area provides the pass gate that is controllable to electrically connect the charge storage structure to a bit line. Thus, for example, activation of a word line will cause stored charges to be transferred by corresponding transistors to bit lines. The bit lines are electrically connected to a node of the transistor by bit line contacts.

The area required for each memory cell in a memory array partially determines the capacity of a memory IC. This area is a function of the number of elements in each memory cell and the size of each of the elements. For example, FIG. 1A illustrates an array 100 of memory cells 110 for a conventional dynamic random access memory (DRAM) device. Memory cells 110 are typically formed in adjacent pairs, where each pair of cells is formed in a common active area 120 and share a common source/drain region that is connected to a respective digit line via a digit line contact 124. The area of the memory cells 110 is said to be $8F^2$, where F represents a minimum feature size for photolithographically defined features. For conventional $8F^2$ memory cells, the dimension of the cell area is 2F×4F. The dimensions of a conventional $8F^2$ memory cell are measured along a first axis from the center of a shared digit line contact 124 (½F), across a word line 128 that represents an access transistor (1F), a storage capacitor 132 (1F), an adjacent word line 136 (1F), and half of an isolation region 140 (½F) separating the active area 120 of an adjacent pair of memory cells (i.e., resulting in a total of 4F). The dimensions along a second perpendicular axis are half of an isolation region 150 on one side of the active area 120 (½F), the digit line contact 124 (1F), and half of another isolation region 154 on the other side of the active area 120 (½F) (i.e., resulting in a total of 2F).

In some state-of-the-art memory devices, the memory cells for megabit DRAM have cell areas approaching $6F^2$. FIG. 1B illustrates aligned memory cells used to form a DRAM wherein all memory cells along a word line are simultaneously accessed and the area of each memory cell 101 is $3F\times2F=6F^2$. The $6F^2$ memory cell 101 illustrated has an open digit line array architecture. In FIG. 1B, a box is drawn around the memory cell 101 or memory bit to show the cell's outer boundary. As shown in more detail in FIG. 1C, along the horizontal axis of the memory cell 101, the box includes one-half digit line contact feature 102 (½F), one word line feature 104 (1F), one capacitor feature 106 (1F), and one-half field oxide feature 108 (½F), totaling three features. Along the vertical axis of the memory cell 101, the box contains two one-half field oxide features 112, 114 (½F, ½F) and one active area feature 116 (1F), totaling two features such that the structure of the memory cell 101 results in its area being $3F\times2F=6F^2$. A digit line 105 passes through the active area, orthogonally to word line 104.

Although this $6F^2$ memory cell offers an approximately 25% improvement in memory cell area relative to conventional $8F^2$ memory cells, as previously described, a further reduction in memory cell size is still desirable. Memory arrays having memory cell areas approaching $4F^2$ require novel devices and are, therefore, more expensive to fabricate. Additional equipment and processing steps drive up the costs of conventional $4F^2$ memory cells. Therefore, there is a need for a still more compact memory cell structure and method for forming the same.

Accordingly, the inventor has recognized the need for a high performance DRAM which includes more memory cells within the same area of DRAM real estate.

BRIEF SUMMARY OF THE INVENTION

The present invention, in a number of exemplary embodiments, includes an array of DRAM cells, each DRAM cell having an area of $5F^2$, methods of fabricating an array of DRAM cells, and electronic systems including DRAM cells having an area of $5F^2$.

In accordance with one aspect of the present invention, an array of DRAM cells includes a plurality of cross-shaped active areas, each cross-shaped active area having a plurality of arm portions and a body portion. A polysilicon gate area is disposed over one arm portion of the plurality of arm portions of at least some of the plurality of cross-shaped active areas, and at least one capacitor is electrically coupled to the polysilicon gate area. A buried digit line electrically couples to a body portion of at least one cross-shaped active area, and a buried word line is positioned substantially orthogonally to the buried digit line and is electrically coupled with the polysilicon gate area.

In accordance with another aspect of the present invention, an array of DRAM cells includes a plurality of cross-shaped active areas, each cross-shaped active area having four associated capacitors. A plurality of polysilicon gate areas is included, each polysilicon gate area disposed over a portion of four of the plurality of cross-shaped active areas and electrically coupled with one associated capacitor of each of the four cross-shaped active areas. A buried digit line is electrically coupled with at least one cross-shaped active area, and a buried word line is positioned substantially orthogonally to the buried digit line and electrically couples to at least one polysilicon gate area.

One embodiment of a method of forming a plurality of memory cells on a surface of a substrate includes forming at least one cross-shaped active area having a plurality of arms in the substrate, forming a like plurality of capacitors, each capacitor associated with an arm of the at least one cross-shaped active area, disposing a polysilicon gate area over an arm of the plurality of arms, forming a buried digit line electrically coupled to a portion of the at least one cross-shaped active area, and forming a buried word line electrically coupled to the polysilicon gate area.

Other features and advantages of the present invention will become apparent to those of skill in the art through consideration of the ensuing description, the accompanying drawings, and the appended claims.

DETAILED DESCRIPTION OF THE INVENTION

Figure 2:
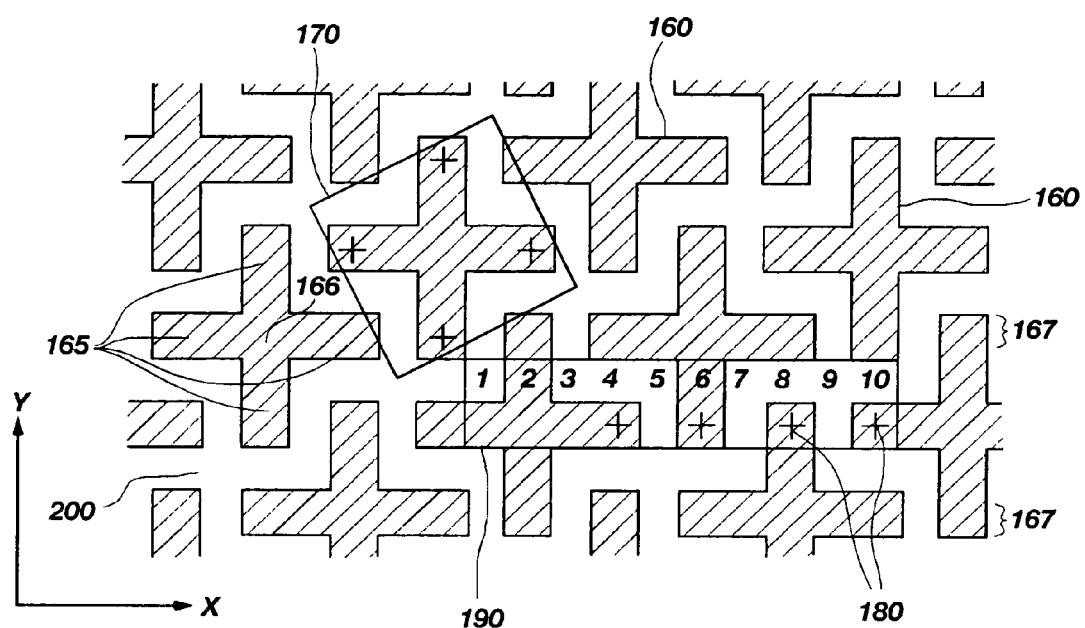
FIG. 2 is a simplified top plan view of active areas of an array of memory cells, in accordance with an embodiment of the present invention.

An exemplary embodiment of an arrangement of active areas of an array of memory cells according to the present invention is depicted in FIG. 2. A plurality of cross-shaped active areas 160 is arranged with each succeeding cross-shaped active area 160 offset by 4F in the x direction and 2F in the y direction. Each cross-shaped active area 160 is depicted as having four arms 165 extending from a body portion 166. The body portion 166 has an area of $1F^2$, and each arm 165 has a width of 1F, and a length of 2F. Each arm 165 is positioned at approximately a 90° angle from each of the two adjacent arms 165.

The cross-shaped active areas 160 are packed more densely than the active areas of a conventional array of memory cells, and each cross-shaped active area 160 is shared by four cells. Each cell includes a capacitor, or storage node 180, represented with a "+" and positioned at a distal tip 167 of each active area arm 165. It is noted that the term "capacitor" as used herein means and includes an information retention device, whether such information is retained through energy storage, structural orientation and reorientation, or otherwise.

Each cross-shaped active area 160 maybe isolated from adjacent cross-shaped active areas 160 by isolation region 200. The cross-shaped active areas 160 may be, for example, n-type active areas formed in a p-type substrate. The cross-shaped active areas 160 and isolation regions 200 may be formed using conventional methods, for example, conventional masking, deposition, implant and drive-in processes.

The total dimensions of a four cell area is $20F^2$, illustrated for clarity in FIG. 2 both as a $\sqrt{20F} \times \sqrt{20F}$ square 170 and as a 10F×2F rectangle 190. The area of the square is $20F^2$ and includes four storage nodes 180. Therefore, each cell has an area of $20F^2/4=5F^2$. Turning to the illustrated rectangle, the total area of each cross-shaped active area is $9F^2$ and includes four storage nodes 180. The depicted rectangle includes a total active area of $9F^2$ and a total area of $\sim 20F^2$. Therefore, each cell has an area of $$\frac{4 nodes}{9F^2 \text{active\_area}} * \frac{9F^2 \text{active\_area}}{20F^2} = \frac{4 nodes}{20F^2} = 5F^2$$

Figure 1A:
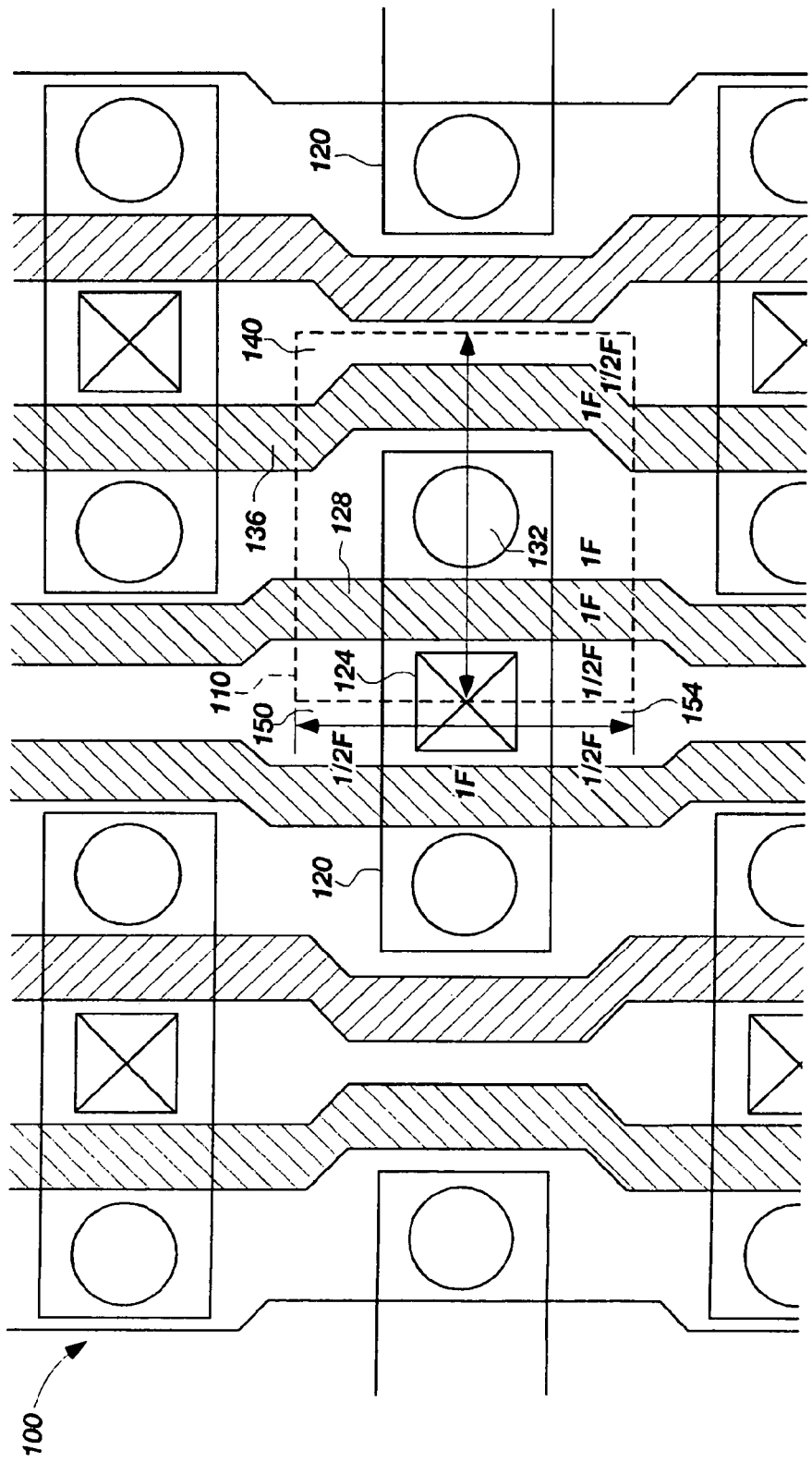
FIG. 1A is a simplified top plan view of an array of conventional memory cells.
Figure 1B:
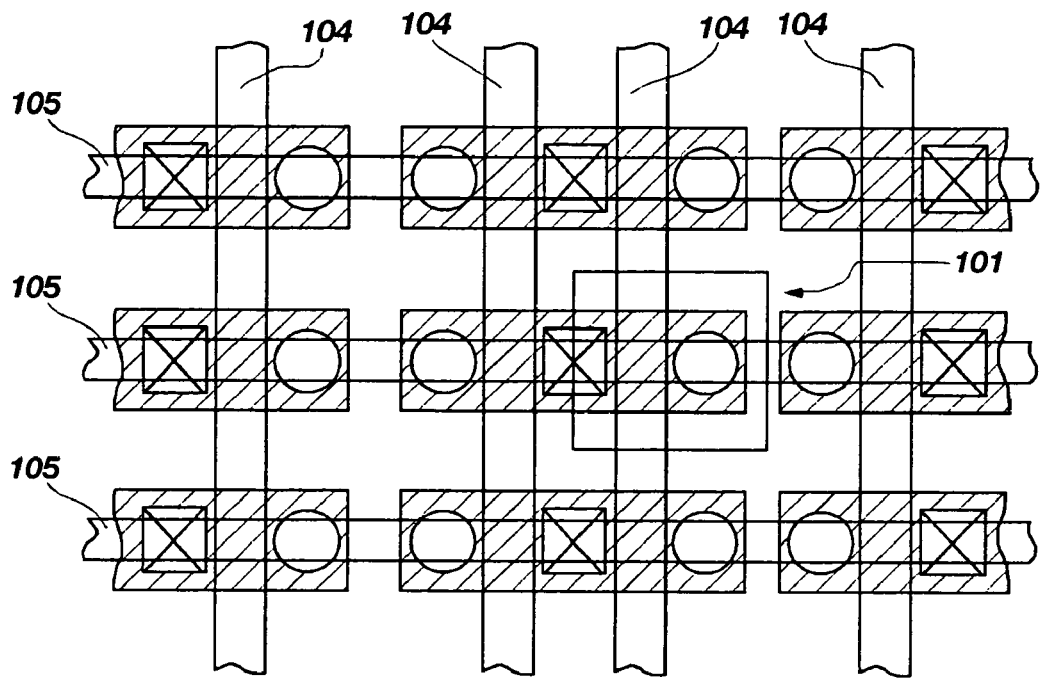
FIG. 1B is a simplified top plan view of another array of conventional memory cells.
Figure 1C:
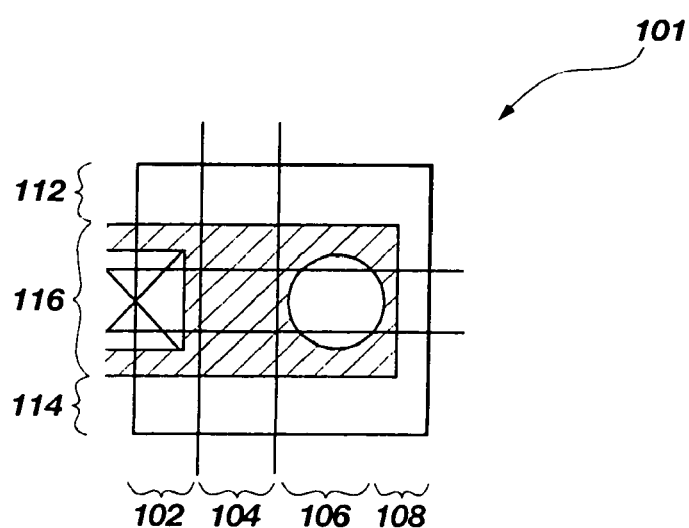
FIG. 1C is a simplified top plan view of a memory cell of the array of FIG. 1B.

The reduction in cell area, as compared to memory cells having cell areas of $8F^2$ and $6F^2$ is accomplished in part by the sharing of a digit line contact between four cells rather than just two cells, as shown in the conventional memory cells 101, 110 of FIGS. 1A and 1C. Word lines are wired to enable a unique contact to each of the four cells sharing the digit line contact. A more detailed description of the memory cell of the present invention will be provided with respect to FIGS. 3 through 9, which illustrate any array of memory cells in a layered fashion showing additional structures of the cells, layer by layer, for clarity.

Figure 3:
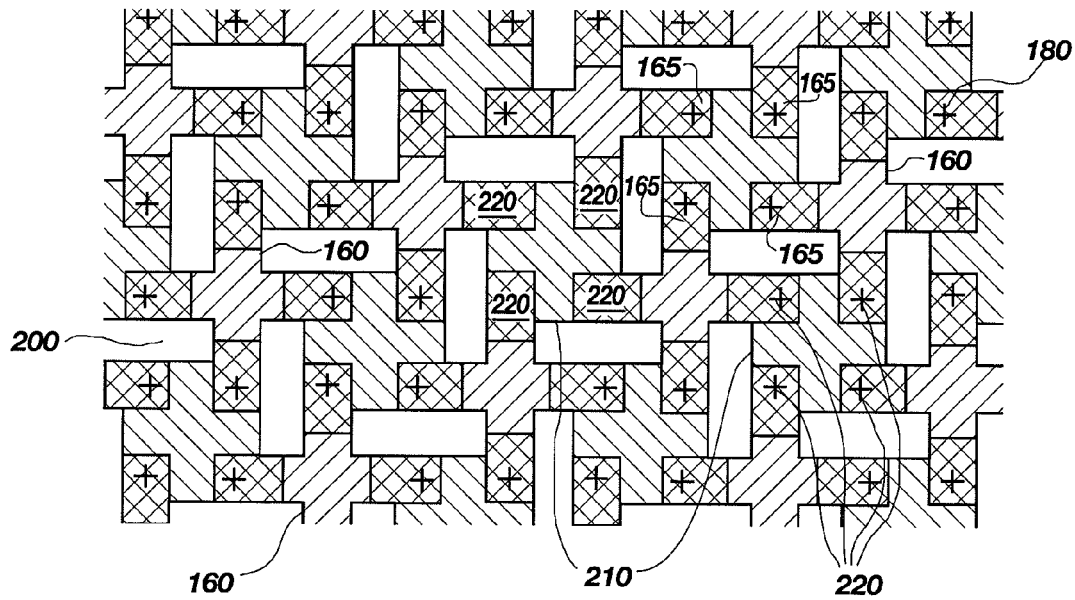
FIG. 3 is a simplified top plan view of some structures of an array of memory cells, in accordance with an embodiment of the present invention.

FIGS. 3 through 9 illustrate one embodiment of an array of memory cells according to the present invention, incorporating the cross-shaped active areas 160 depicted in FIG. 2. The various structures of each memory cell of this embodiment are configured for an array of memory cells including trench style or other non-stacked capacitors accessed using vertical transistors. FIG. 3 illustrates a plurality of polysilicon gate areas 210 overlying the plurality of cross-shaped active areas 160 and isolation region 200. The cross-shaped active areas 160 are packed such that four neighboring arms 165, each being associated with one of four adjacent cross-shaped active areas 160, are in close proximity to one another, yet separated by the isolation region 200. Each polysilicon gate area 210 overlies four neighboring arms 165 and the isolation region 200 separating them. The region of the polysilicon gate area 210 overlying the arm 165 of the cross-shaped active area 160 forms the gate region 220. Each polysilicon gate area 210 includes four gate regions 220. A polysilicon layer may be formed over the structure of FIG. 2 followed by a conventional masking and etch process to selectively remove portions of the polysilicon layer in order to form the polysilicon gate areas 210.

Figure 4:
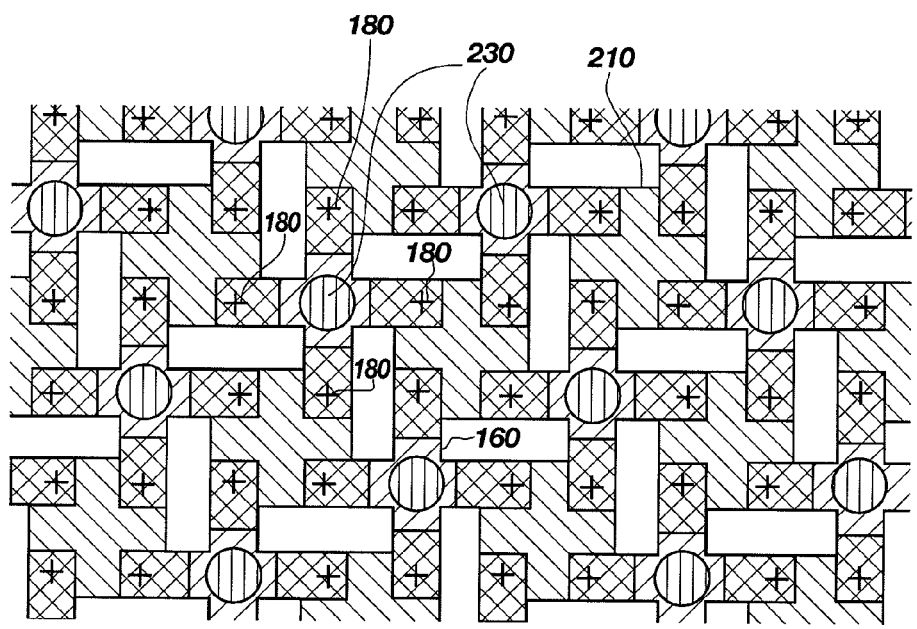
FIG. 4 is another simplified top plan view of some structures of the array of memory cells, in accordance with the embodiment of FIG. 3.

FIG. 4 illustrates a plurality of digit line, or bit line contacts 230 added to the layout of FIG. 3. Each bit line contact 230 may be positioned at the center of each cross-shaped active area 160 and provide electrical connection thereto. Four storage nodes 180 are associated with each cross-shaped active area 160; thus, each bit line contact 230 provides an electrical connection for four storage nodes 180. The bit line contact 230, or "bitcon," may be formed of a conductive material deposited over the structure of FIG. 3 to electrically contact the cross-shaped active area 160. The conductive material is conventionally masked and etched to form the plurality of bit line contacts 230.

Figure 5:
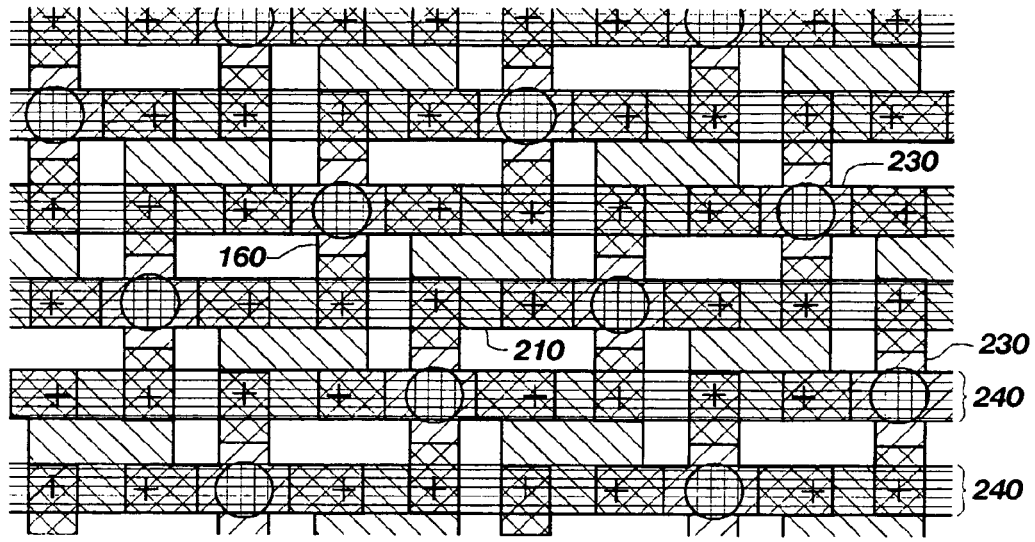
FIG. 5 is another simplified top plan view of some structures of the array of memory cells, in accordance with the embodiment of FIG. 3.
Figure 6:
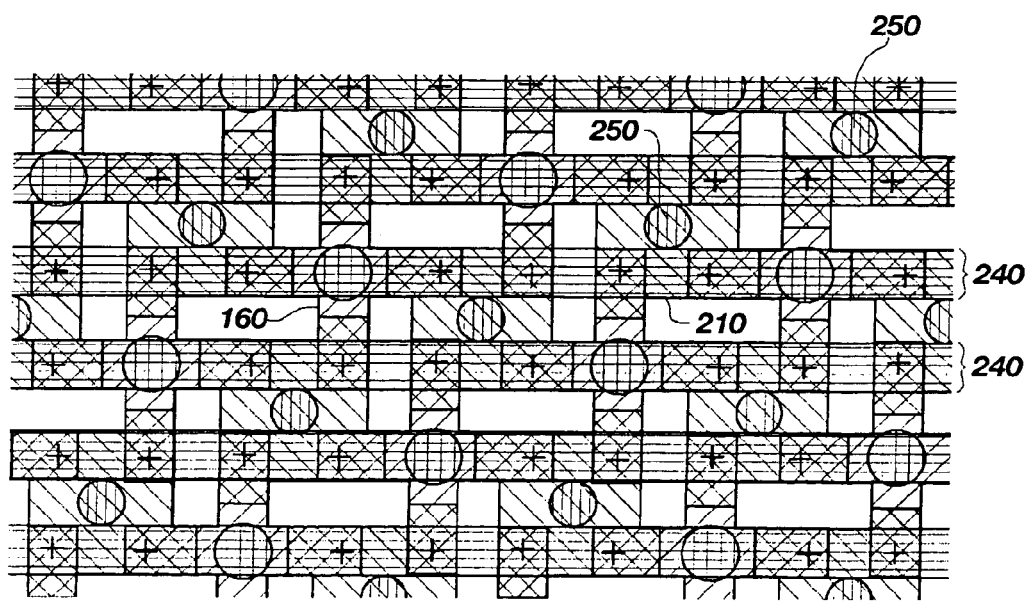
FIG. 6 is another simplified top plan view of some structures of the array of memory cells, in accordance with the embodiment of FIG. 3.

FIG. 5 illustrates bit lines, or digit lines 240. The plurality of digit lines 240 run generally in parallel to each other, and each digit line 240 crosses at least one bit line contact 230. The digit lines 240 couple with the cross-shaped active areas 160 through the bit line contacts 230. Formation of the digit lines 240 is well known in the art. The digit lines 240 may be formed using conventional processing methods of, for example, silicon, tungsten, aluminum, copper, or a metal silicide, and may be buried digit lines. Digit lines 240 are conventionally used to write to and read data from memory cells. FIG. 6 illustrates the addition of word line contacts 250 positioned over the polysilicon gate area 210. The word line contacts 250 may be positioned centrally on the polysilicon gate area 210 and provide electrical connection thereto. Four neighboring arms 165 (see FIG. 3) of adjacent cross-shaped active areas 160, and therefore four storage nodes 180 are associated with each polysilicon gate area 210, thus each word line contact 250 provides an electrical connection for four storage nodes 180.

Figure 7:
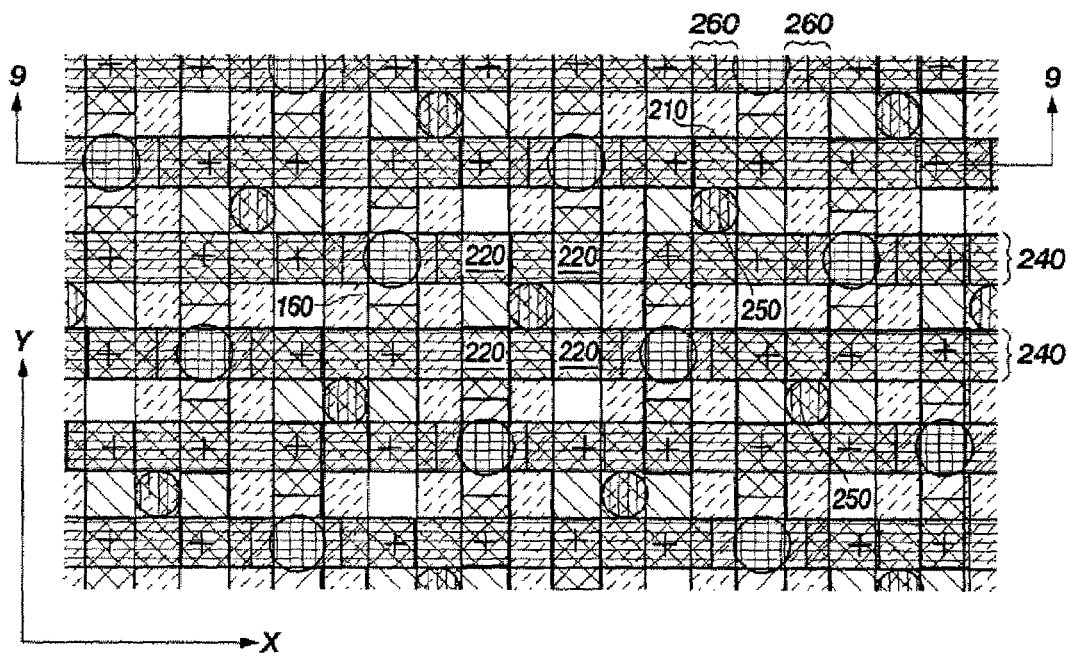
FIG. 7 is another simplified top plan view of the array of memory cells, in accordance with the embodiment of FIG. 3.

FIG. 7 illustrates word lines 260 added to the structure of FIG. 6. The word lines 260 run generally in parallel to each other, in a direction orthogonal to the plurality of digit lines 240. The word lines 260 may be formed using conventional processing methods of, for example, silicon, tungsten, aluminum, copper, or a metal silicide. The word lines 260 couple with the storage nodes 180 of the cross-shaped active areas 160 through the word line contacts 250 and the polysilicon gate areas 210. Word lines are conventionally used to access a particular row of memory cells that are to be written to or read. Referring back to the conventional array 100 of memory cells 110 of FIG. 1A, the word line 128 is continuous, and forms the gate, or access transistor across the bar-shaped active area 120 of each memory cell 110. In the array of memory cells according to the present invention, gate regions 220 of each polysilicon gate area 210 cover and provide access to four neighboring arms 165 (see FIG. 3) of adjacent cross-shaped active areas 160. Thus four different storage nodes 180 of four different memory cells are accessed by the four different gate regions 220 of each single polysilicon gate area 210. Each polysilicon gate area 210 is connected via a single word line contact 250 to a single word line of the plurality of word lines 260. The array depicted in FIG. 7 may include any number of memory cells; therefore, each word line 260 may connect with a plurality of polysilicon gate areas 210 situated along a common y-axis.

Figure 8:
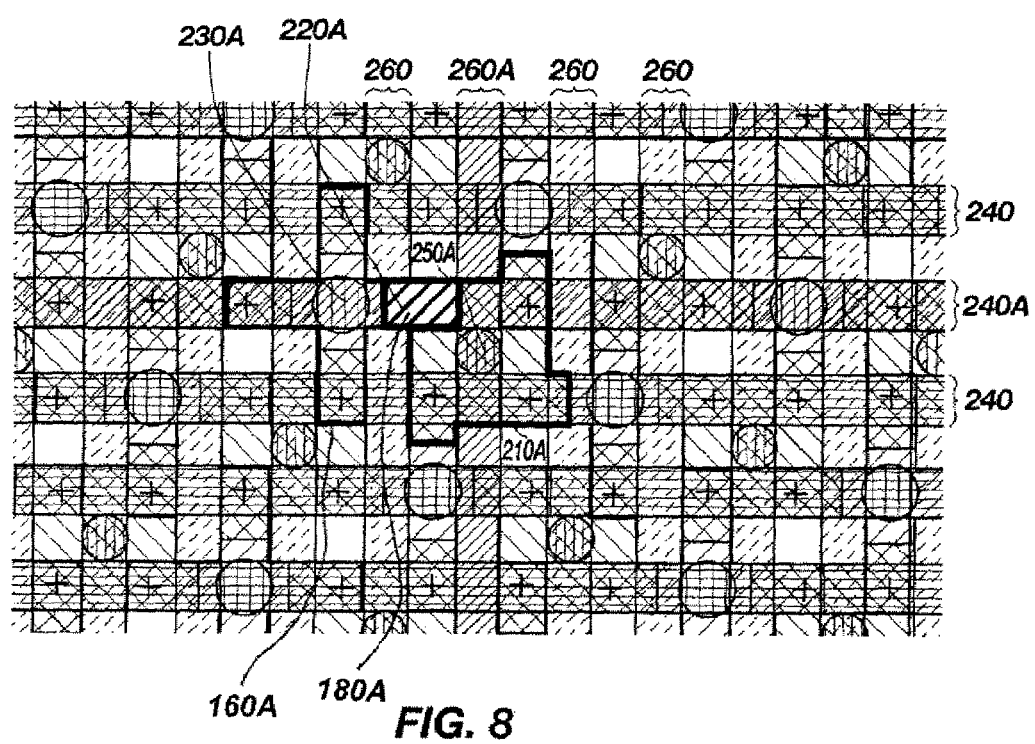
FIG. 8 is a simplified top plan view of the array of memory cells having one cell activated, in accordance with the embodiment of FIG. 3.

Each storage node 180 may be uniquely accessed because memory cells accessed along a given digit line 240 do not share a common word line 260 and memory cells accessed by a given word line 260 do not share a common digit line 240. FIG. 8 illustrates the array of memory cells of FIG. 7, with one word line 260A of the plurality of word lines 260 activated, and one digit line 240A selected, providing unique access to a storage node 180A of a single memory cell of the array. The activated word line 260A is connected to a word line contact 250A, and the memory cells accessed by polysilicon gate area 210A are activated by the word line contact 250A. The selected digit line 240A provides access through bit line contact 230A to cross-shaped active area 160A. The storage node 180A, for example a charge storage structure such as a trench capacitor (not shown) connected by activated gate region 220A to the cross-shaped active area 160A and bit line contact 230A may thus be accessed. Although cross-shaped active area 160A has four associated storage nodes 180, only a single storage node 180A is accessed by the polysilicon gate area 210A. The state, or the stored charge or lack thereof, of the storage node 180A may be transferred to the bit line 240A. The uniquely accessed memory cell may be read or written to in use of a memory device including the memory cells of the present invention.

Figure 9:
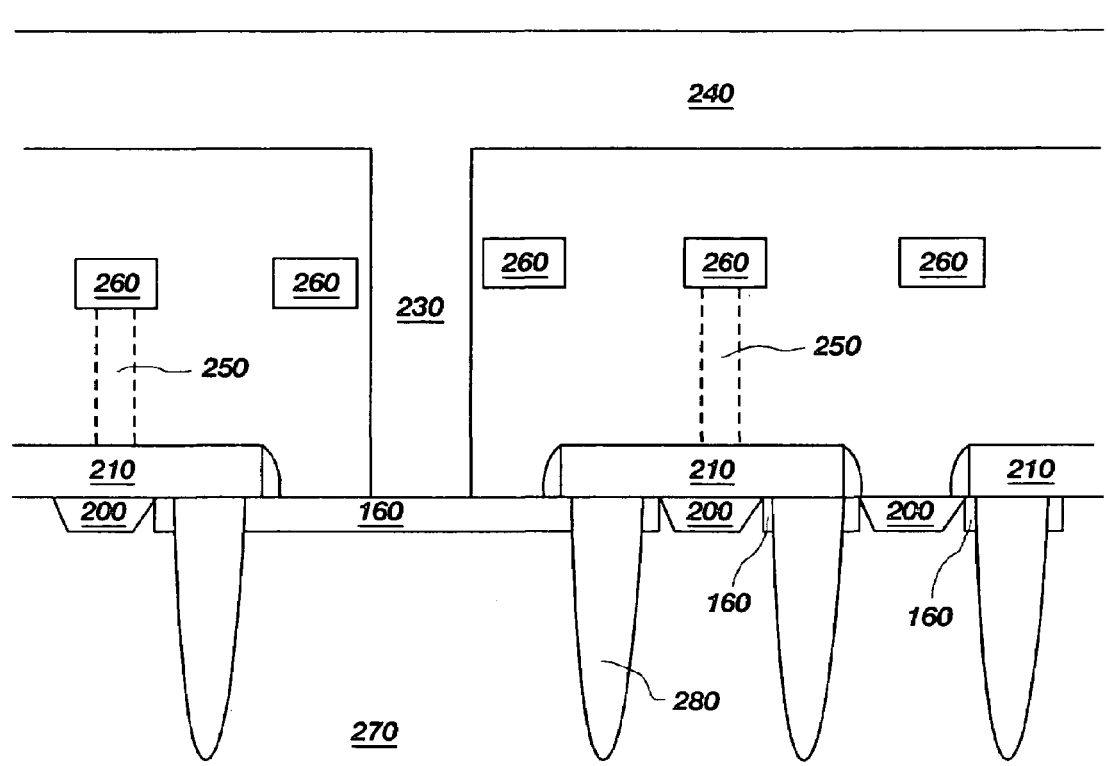
FIG. 9 is a simplified cross-sectional view of the array of memory cells of FIG. 7.

FIG. 9 depicts a partial cross section of the array of memory cells of FIG. 7, taken along line 9-9. Storage nodes 180 in the form of trench capacitors 280, active areas 160, and isolation regions 200 are formed in a substrate 270. Each trench capacitor 280 is formed in a portion of the active areas 160. Polysilicon gate areas 210 cover and provide connection to the active areas 160 and therefore the trench capacitors 280. Word lines 260 are buried in a layer between the digit lines 240 and the substrate 270. Word line contacts 250 electrically couple the word lines 260 with the polysilicon gate areas 210. Optionally, both the digit lines 240 and the word lines 260 may run on top of the cells.

Figure 10:
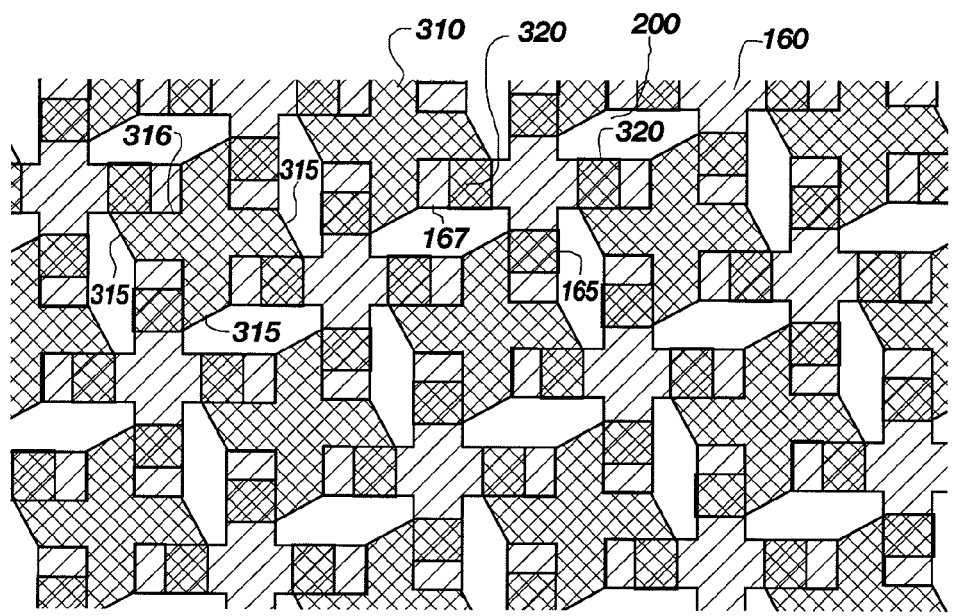
FIG. 10 is a simplified top plan view of some structures of an array of memory cells, in accordance with another embodiment of the present invention.
Figure 11:
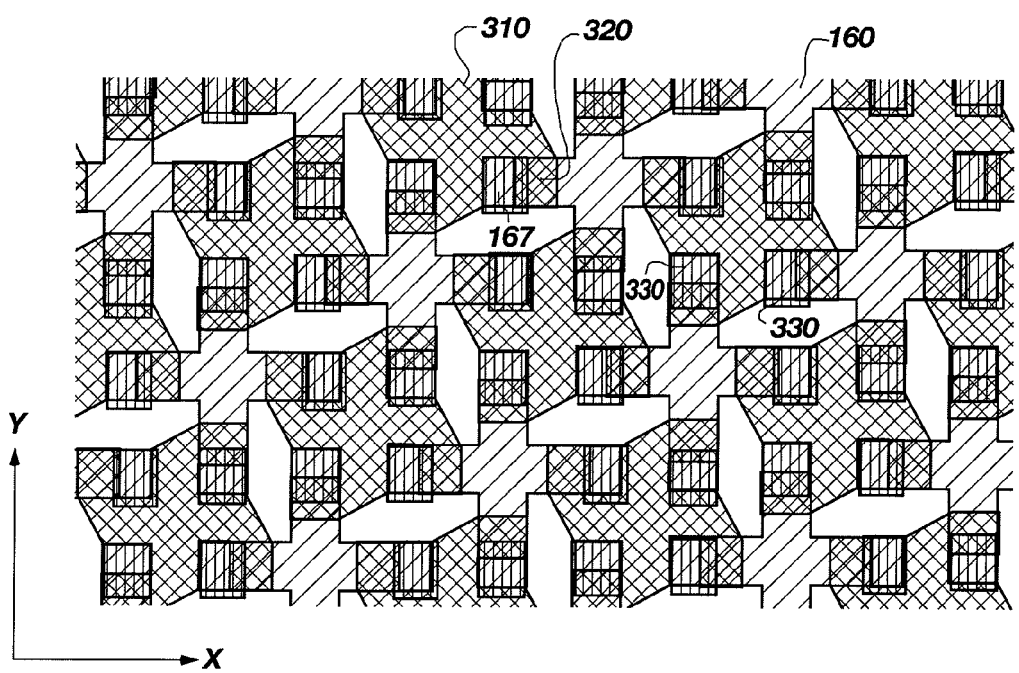
FIG. 11 is another simplified top plan view of some structures of the array of memory cells, in accordance with the embodiment of FIG. 9.
Figure 12:
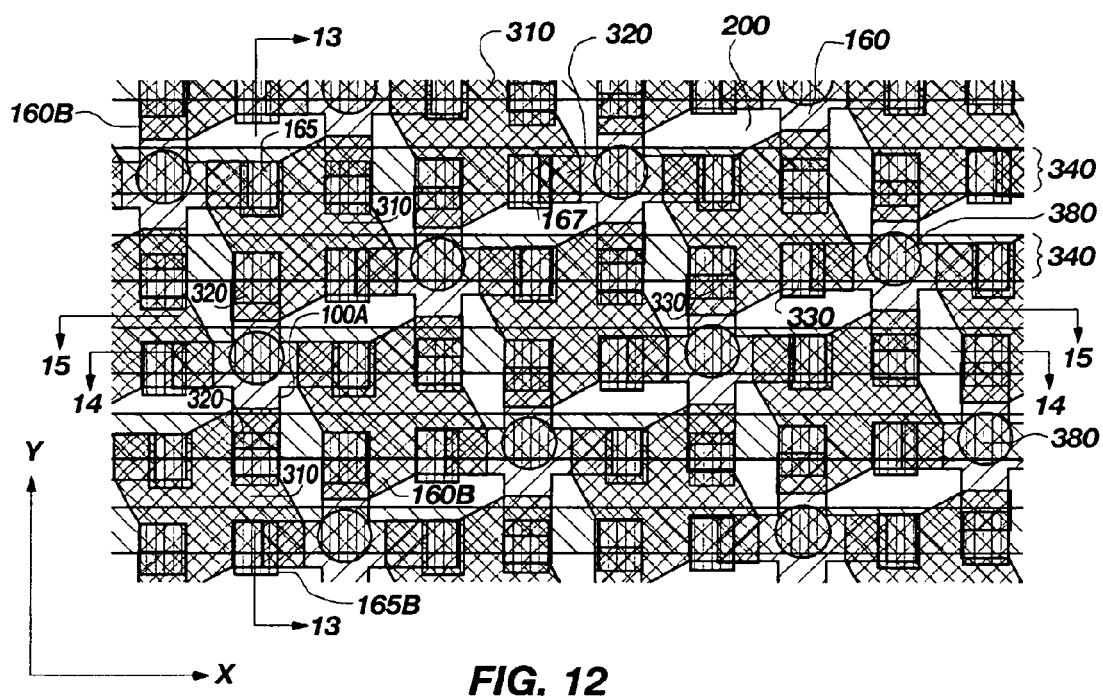
FIG. 12 is another simplified top plan view of some structures of the array of memory cells, in accordance with the embodiment of FIG. 9.

FIGS. 10-12 illustrate a memory cell layout enabling stacked container-style capacitors to be used to fabricate memory cells with a cell area of $5F^2$. On the active area layout depicted in FIG. 2, as depicted in FIG. 10 a plurality of polysilicon gate areas 310 overlie the plurality of cross-shaped active areas 160 and isolation region 200. Each polysilicon gate area 310 may be "pinwheel" shaped, with a plurality of L-shaped branches 315 extending from a central region 316. The distal region of each L-shaped branch comprises a gate arm 320, which provides an electrical connection to an associated active area 160. A gate arm 320 of each polysilicon gate area 310 crosses an arm 165 of a cross-shaped active area 160, but does not cover the distal tip 167 of the active area arm 165, providing space on the distal tip 167 for a storage node 180 in the form of a stacked container-style capacitor 335 (see FIG. 13). The polysilicon gate areas 310 may be formed by a conventional masking and etch process of a polysilicon layer (not shown).

Figure 13:
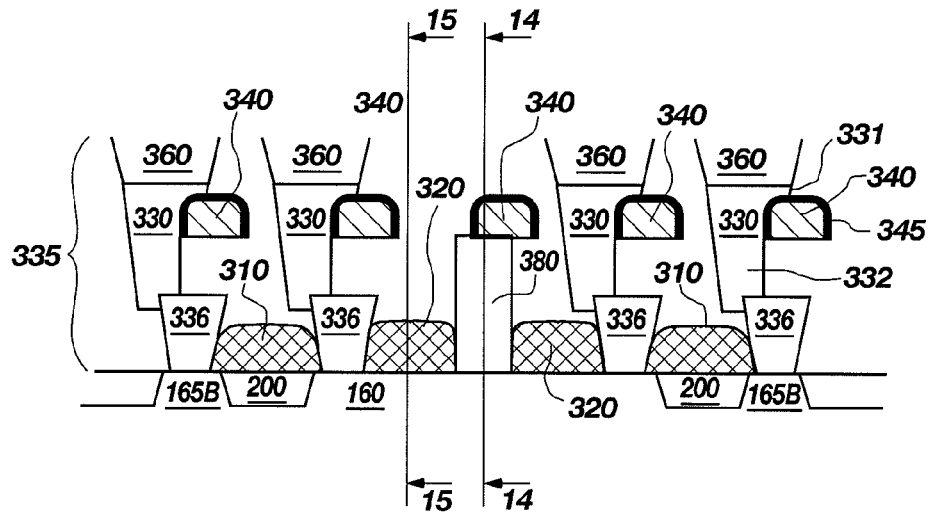
FIG. 13 is a simplified cross-sectional view of the array of memory cells, in accordance with the embodiment of FIG. 9.

FIG. 11 illustrates a plurality of cell contacts 330 added to the layout of FIG. 10. Each cell contact 330 topographically covers the distal tip 167 of the active area arm 165, and extends about ¼F beyond the active area arm 165 in the −y direction. Each cell contact 330 may optionally cover a portion of each gate arm 320. Turning to FIG. 13, the cell contacts 330 provide a transverse contact between a node 336 and a container 360, preventing interference between the buried digit lines 340, buried word lines 370 (FIG. 14) and the container 360. The cell contact 330, the container 360, and the node 336, together make up the storage node 180, in this exemplary embodiment a container-style stacked capacitor 335.

FIG. 12 shows digit lines 340 added to the layout of FIG. 11. The digit lines 340 are offset from the laterally extending active area arms 165 by about ¼F in the y direction. The offset of the digit lines 340 enables the digit lines 340, although buried, (see FIG. 13) to avoid the container-style stacked capacitor 335. Bit line contacts 380 couple the digit lines 340 with the active areas 160, as described with respect to the first embodiment of the present invention. Word lines 370, depicted in cross-section in FIGS. 14 and 15, may be added to the layout, orthogonally to the digit lines 340, as illustrated in the previous embodiment of the invention of FIG. 7. The word lines 370 couple with the polysilicon gate areas 310 using word line contacts 350 (FIG. 15) positioned over the central region 316 of the polysilicon gate areas 310. Each bit line contact 380 couples four storage nodes 180 of an active area 160 with a digit line 340. Each word line contact 350 couples four neighboring storage nodes 180, associated with a single polysilicon gate area 310, with a word line 370. The four storage nodes 180 of an active area 160 are each associated with different polysilicon gate areas 310, therefore a unique contact to each of the four storage nodes 180 is provided, as illustrated with the previous embodiment of the invention, depicted in FIG. 8.

FIG. 13 illustrates a partial cross-section of the memory cell layout of FIG. 12 along line 13-13. The partial cross-section includes a bit line contact 380 centrally located, and the features 5F on either side of the bit line contact. Bit line contacts 380 provide a vertical electrical connection for the digit lines 340 with the cross-shaped active areas 160. Each digit line 340 may be encased by a spacer 345, for example, a silicon nitride spacer that isolates the digit line 340 and prevents shorting. The spacer 345 may additionally provide an etch stop layer. The gate arms 320 are positioned over the active area 160A, on either side of the bit line contact 380. Nodes 336 of the container-style stacked capacitors 335 are positioned over the active area 160A, next to each gate arm 320, remote from the bit line contact 380. Moving farther from the bit line contact 380, portions of the gate areas 310 overlie isolation regions 200. The container-style stacked capacitors 335 depicted on the far sides of FIG. 13 overlie the arms 165B of active areas 160B adjacent to the active area 160A.

The transverse nature of cell contact 330 is illustrated in FIG. 13. The node 336 provides contact with the active area 160, however the digit line 340 topographically overlies the node 336, preventing a direct, vertical contact. The cell contact 330 provides an offset connection between the node 336 and the container 360, with a lower portion 332 bridging the digit line 340, and a top end 331 wrapping around the digit line 340. The cell contact 330 may be widest at the top end 331, located above the digit line 340 and proximate the container 360. The top end 331 of the cell contact 330 may extend partially across the digit line 340, providing an increased surface area for contact with the container 360.

Figure 14:
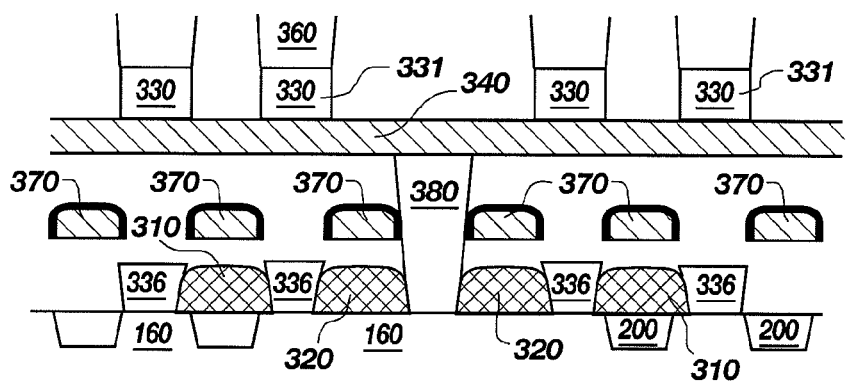
FIG. 14 is another simplified cross-sectional view of the array of memory cells, in accordance with the embodiment of FIG. 9.

The partial cross-section depicted in FIG. 14, taken along line 14-14, includes buried word lines 370. The buried word lines 370 are substantially orthogonal to the buried digit line 340, and are depicted buried between the active area 160 and the buried digit line 340. Buried digit line 340 sandwiched between the active area 160 and the buried word lines 370 are also within the scope of the present invention.

The top end 331 of the cell contacts 330 and the containers 360 extend above the digit line 340. The lower portion 332 of the cell contacts 330 does not appear in the cross-section taken at line 14-14 because of the transverse nature of the cell contacts 330, which enables the cell contacts 330 to bridge the digit line 340. The gate arms 320 are positioned over the active area 160, on either side of the bit line contact 380. Nodes 336 of the container-style stacked capacitors 335 are positioned over the active areas 160.

Figure 15:
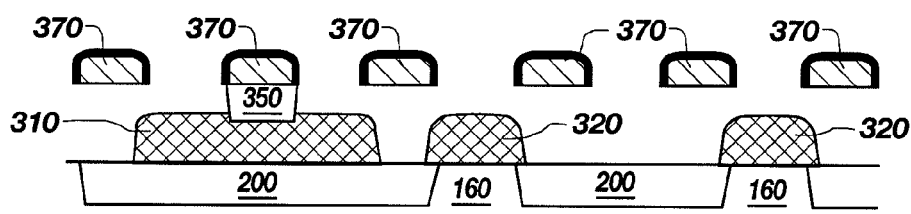
FIG. 15 is yet another simplified cross-sectional view of the memory cells, in accordance with the embodiment of FIG. 9.

FIG. 15 depicts another partial cross-section, taken along line 15-15. The word line contact 350 provides a vertical electrical connection between the polysilicon gate area 310 and a word line 370. The portion of the polysilicon gate area 310 directly contacting the word line contact 350 overlies the isolation region 200. Gate arms 320 of adjacent polysilicon gate areas 310 overlie active areas 160.

In yet another embodiment of the present invention, each cell of the array of memory cells of FIG. 12 may be extended or stretched in the y-dimension, resulting in a cell area of $5.625F^2$. The digit lines 340 of a stretched cell may be offset by about ½F in the y direction, and the cell contacts by ¼F in the -y direction, enabling the lower portion 332 of the cell contact 330 to be of increased girth in relation to the cell contacts 330 of a $5F^2$ cell. The active area arms 165 extending in the y and the -y direction may be increased in length by 0.25F. Referring back to the rectangle 190 of FIG. 2, the total dimensions of a four stretched cell area is $22.5F^2$, a $10F \times 2.25F$ rectangle. Therefore, each cell has an area of $22.5F^2/4=5.65F^2$.

The memory cells of the present invention may be formed using conventional techniques, particularly those used to form conventional $6F^2$ memory devices. Additional masking and etching steps may be required, in comparison to some conventional $6F^2$ memory devices. An array of memory cells of the present invention, compared to an array of the same number of memory cells configured for a $6F^2$ memory device is about 17% smaller, enabling periphery circuits of the memory device to be smaller.

A comparative cost analysis of a $5F^2$ memory device of the present invention and a conventional $6F^2$ memory device indicates that the memory device of the present invention is less expensive if the yield of usable devices is comparable. A conventional $6F^2$ process may use 26 layers to form an array of memory cells. The $5F^2$ process of the present invention may use 28 to 29 layers. The additional layers of the $5F^2$ process may include: the polysilicon layer forming the polysilicon gate areas 210, 310; the layer forming the word line contacts 250, 350; and an additional layer for the top end 331 of the cell contacts 330, separating the container 360 from the buried digit line 340, in the embodiment including stacked container-style capacitors 335. The processed wafer cost such as the raw wafer cost and other fixed costs may be assumed to be a fixed amount K1. The cost per mask, that is, the cost to form each layer may be assumed to be C.

$$6F^2 \text{Cost} = K1 + 26 {}^*C$$

$$5F^2 \text{Cost} = K1 + 29 {}^*C$$

Equations 2 and 3

The fixed amount K1 will typically be a few times larger than C. Assuming K1 is three times C, the $5F^2$ process is about 10% more expensive than the $6F^2$ process.

$$6F^2 \text{Cost} = 3C + 26C = 29C$$

$$5F^2 \text{Cost} = 3C + 29C = 32C$$

$$\frac{32C}{29C} = 1.10$$

However, the 6F² array is twenty percent larger than the 5F² array (6/5=1.20). The array and the periphery of a 5F² die are smaller; therefore, the die may be smaller, representing a cost savings due to the greater number of dice per wafer. The cost savings will be increased if only 28 layers, or two additional masks, are used in the manufacturing process.

The conductive word lines 260, 370 and digit lines 240, 340 may be collectively referred to as "address lines." These address lines are electrically coupled to periphery circuitry so that each of the memory cells can be accessed for the storage and retrieval of information. The periphery circuitry may include circuitry for addressing the memory cells contained within the array of memory cells, along with circuitry for storing data in and retrieving data from the memory cells. The periphery circuitry may also include other circuitry used for controlling or otherwise insuring the proper functioning of the memory device. The array of 5F² memory cells is smaller than an array of 6F² or 8F² memory cells; therefore, the periphery circuitry may be more compact.

Figure 16:
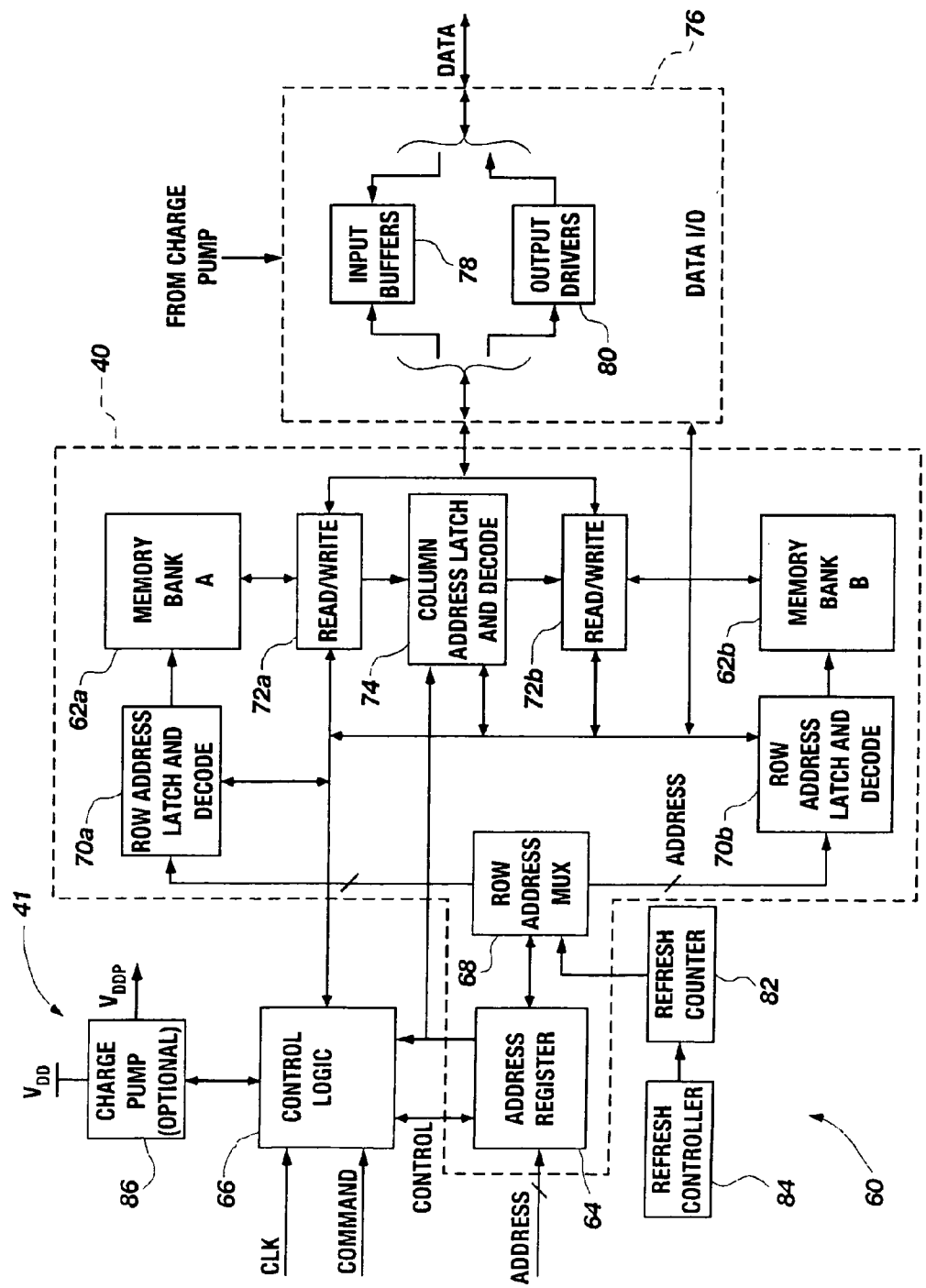
FIG. 16 is a functional block diagram of a memory circuit that includes memory cells according to an embodiment of the present invention.

FIG. 16 is a functional block diagram of one embodiment of a memory circuit 60, which includes memory banks 62a and 62b. These memory banks each incorporate a memory array including memory cells according to an embodiment of the present invention. In one embodiment, the memory circuit 60 is a synchronous DRAM (SDRAM), although it may be another type of memory in other embodiments.

The memory circuit 60 includes an address register 64, which receives an address from an ADDRESS bus. A control logic circuit 66 (i) receives a clock (CLK) signal; (ii) receives clock enable (CKIE), chip select (CS), row address strobe (RAS), column address strobe (CAS), and write enable (WE) signals from the COMMAND bus, and (iii) communicates with the other circuits of the memory device. A row-address multiplexer 68 receives the address signal from the address register 64 and provides the row address to the row-address latch-and-decode circuits 70a and 70b for the memory bank 62a or the memory bank 62b, respectively. During read and write cycles, the row-address latch-and-decode circuits 70a and 70b activate the word lines of the addressed rows of memory cells in the memory banks 62a and 62b, respectively. Read/write circuits 72a and 72b read data from the addressed memory cells in the memory banks 62a and 62b, respectively, during a read cycle, and write data to the addressed memory cells during a write cycle. A column-address latch-and-decode circuit 74 receives the address from the address register 64 and provides the column address of the selected memory cells to the read/write circuits 72a and 72b. For clarity, the address register 64, the row-address multiplexer 68, the row-address latch-and-decode circuits 70a and 70b, and the column-address latch-and-decode circuit 74 can be collectively referred to as an address decoder 40.

A data input/output (I/O) circuit 76 includes a plurality of input buffers 78. During a write cycle, the buffers 78 receive and store data from the DATA bus, and the read/write circuits 72a and 72b provide the stored data to the memory banks 62a and 62b, respectively. The data I/O circuit 76 also includes a plurality of output drivers 80. During a read cycle, the read/write circuits 72a and 72b provide data from the memory banks 62a and 62b, respectively, to the drivers 80, which in turn provide this data to the DATA bus.

A refresh counter 82 stores the address of the row of memory cells to be refreshed either during a conventional auto-refresh mode or self-refresh mode. After the row is refreshed, a refresh controller 84 updates the address in the refresh counter 82, typically by incrementing or decrementing, the contents of the refresh counter 82 by one. Although shown separately, the refresh controller 84 may be part of the control logic circuit 66 in other embodiments of the memory circuit 60. The memory circuit 60 may also include an optional charge pump 86, which steps up the power-supply voltage $V_{DD}$ to a voltage $V_{DDP}$. In one embodiment 41, the charge pump 86 generates $V_{DDP}$ approximately 1-1.5 V higher than $V_{DD}$. The memory circuit 60 may also use $V_{DDP}$ to conventionally overdrive selected internal transistors.

Figure 17:
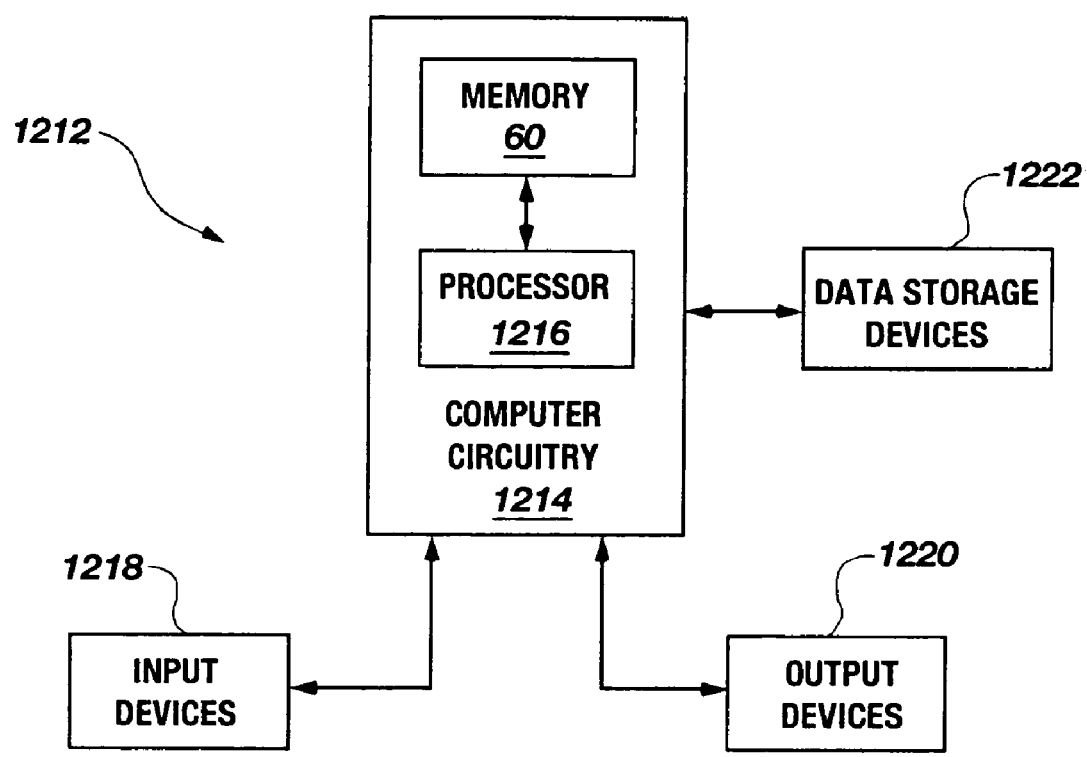
FIG. 17 is a functional block diagram of a computer system including a memory device, according to one or more embodiments of the present invention.

FIG. 17 is a block diagram of an electronic system 1212, such as a computer system, that incorporates the memory circuit 60 of FIG. 16. The system 1212 also includes computer circuitry 1214 for performing computer functions, such as executing software to perform desired calculations and tasks. The circuitry 1214 typically includes a processor 1216 and the memory circuit 60, which is coupled to the processor 1216. One or more input devices 1218, such as a keyboard or a mouse, are coupled to the computer circuitry 1214 and allow an operator (not shown) to manually input data thereto. One or more output devices 1220 are coupled to the computer circuitry. 1214 to provide to the operator data generated by the computer circuitry 1214. Examples of such output devices 1220 include a printer and a video display unit. One or more data storage devices 1222 are coupled to the computer circuitry 1214 to store data on or retrieve data from external storage media (not shown). Examples of the storage devices 1222 and the corresponding storage media include drives that accept hard and floppy disks, tape cassettes, and compact disk read-only memories (CD-ROMs). Typically, the computer circuitry 1214 includes address data and command buses and a clock line that is respectively coupled to the ADDRESS, DATA, and COMMAND buses, and the CLK line of the memory circuit 60.

Although the foregoing description contains many specifics, these should not be construed as limiting the scope of the present invention, but merely as providing illustrations of some exemplary embodiments. Similarly, other embodiments of the invention may be devised that do not depart from the spirit or scope of the present invention. Features from different embodiments may be employed in combination. An array of memory cells having more or less than four memory cells accessed by each polysilicon gate area is within the scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are to be embraced thereby.

What is claimed is:

1. An array of DRAM cells, comprising:
    a plurality of cross-shaped active areas, each cross-shaped active area comprising a body portion comprising a centrally located drain and four arm portions located around the body portion, each cross-shaped active area spaced apart from another cross-shaped active area by a substantially uniform distance with arms of adjacent cross-shaped active areas aligned parallel to one of two perpendicular axes;
    a polysilicon gate area disposed over a group of adjacent arm portions of four cross-shaped active areas, each peripheral edge of the polysilicon gate area being oriented parallel to one of the two perpendicular axes;

at least one capacitor of each of the cross-shaped active areas of the four cross-shaped active areas being electrically coupled to the polysilicon gate area;

a buried digit line parallel to one of the two perpendicular axes and electrically coupled to the body portion of at least one cross-shaped active area; and a buried word line positioned substantially orthogonally to the buried digit line parallel to another of the two perpendicular axes and electrically coupled with the polysilicon gate area.

2. The array of claim 1, wherein each cross-shaped active area is a discrete active area isolated from other discrete active areas.

3. The array of claim 1, wherein the at least one capacitor comprises a stacked container-style capacitor.

4. The array of claim 3, wherein the polysilicon gate area comprises a polysilicon body portion and four arms forming gates.

5. The array of claim 1, wherein the at least one capacitor comprises a trench-style capacitor.

6. The array of claim 5, wherein the polysilicon gate area comprises a substantially continuous polysilicon structure.

7. The array of claim 1, wherein the buried digit line and the body portion of each cross-shaped active area topologically overlap.

8. The array of claim 1, wherein each cross-shaped active area comprises an area of nine features (F) squared.

9. The array of claim 2, wherein each arm portion of the plurality of arm portions comprises an area of two features (F) squared.

10. The array of claim 9, wherein the body portion comprises an area of one feature (F) squared.

11. The array of claim 1, wherein each cross-shaped active area is offset from another cross-shaped active area by a distance of four features (F) in a first direction and two features (F) in a second, orthogonal direction.

12. The array of claim 1, wherein the at least one capacitor comprises four capacitors.

13. The array of claim 12, wherein each of the four capacitors is associated with a different cross-shaped active area of the plurality of cross-shaped active areas.

14. The array of claim 1, further comprising a digit line contact for electrically coupling the buried digit line to the body portion of cross-shaped active areas of the plurality, the digit line contact shared by four DRAM cells.

15. The array of claim 1, wherein each DRAM cell has an area of five features (F) squared when measuring the area of the array, divided by the number of DRAM cells.

16. An array of DRAM cells, comprising:

a plurality of cross-shaped active areas, each cross-shaped active area comprising a body portion and an associated capacitor located on each of four arm portions located around the body portion, each cross-shaped active area spaced apart from another cross-shaped active area by a substantially uniform distance with arms of adjacent cross-shaped active areas aligned parallel to one of two perpendicular axes;

a plurality of polysilicon gate areas, each polysilicon gate area disposed over a portion of four of the plurality of cross-shaped active areas and electrically coupled with one associated capacitor of each of the four cross-shaped active areas;

a buried digit line parallel to one of the two perpendicular axes and electrically coupled to at least one cross-shaped active area; and a buried word line positioned substantially orthogonally to the buried digit line parallel to another of the two perpendicular axes and electrically coupled to at least one polysilicon gate area.

17. The array of claim 16, wherein the body portion comprises a drain.

18. The array of claim 16, wherein each cross-shaped active area is a discrete active area isolated from other discrete active areas.

19. The array of claim 16, wherein the four associated capacitors comprise stacked container-style capacitors.

20. The array of claim 19, wherein each polysilicon gate area comprises a polysilicon body portion and four arms forming gates.

21. The array of claim 16, wherein each of the four associated capacitors comprises a trench-style capacitor.

22. The array of claim 21, wherein each polysilicon gate area comprises a substantially continuous polysilicon structure.

23. The array of claim 17, wherein the buried digit line and the body portion of each cross-shaped active area of the plurality topologically overlap.

24. The array of claim 16, wherein each cross-shaped active area comprises an area of nine features (F) squared.

25. The array of claim 17, wherein each arm portion of the plurality of arm portions comprises an area of two features (F) squared.

26. The array of claim 17, wherein the body portion comprises an area of one feature (F) squared.

27. The array of claim 16, wherein each cross-shaped active area is offset from another cross-shaped active area by a distance of four features (F) in a first direction and two features (F) in a second, orthogonal direction.

28. The array of claim 16, further comprising a digit line contact for electrically coupling the buried digit line to each cross-shaped active area of the plurality, the digit line contact shared by four DRAM cells.

29. The array of claim 16, wherein each DRAM cell has an area of five features (F) squared when measuring the area of the array divided by the number of DRAM cells.

30. An electronic system, comprising:

a processor having a processor bus;

an input device coupled to the processor through the processor bus and adapted to allow data to be input to the electronic system;

an output device coupled to the processor through the processor bus and adapted to allow data to be output from the electronic system; and a memory device coupled to the processor through the processor bus, the memory device comprising:

a memory array, comprising:

a plurality of cross-shaped active areas, each cross-shaped active area having a plurality of arm portions and a body portion and being offset from each successive cross-shaped active area by a first predetermined distance in a first direction and a second predetermined direction in a second, orthogonal direction, the second predetermined distance being twice the first predetermined distance such that at least two of the cross-shaped active areas are aligned in both the first direction and the second direction;

a polysilicon gate area disposed over one arm portion of the plurality of arm portions of at least some of the plurality of cross-shaped active areas;

at least one capacitor electrically coupled to the polysilicon gate area;

a buried digit line parallel to at least one arm portion of the plurality of arm portions and electrically coupled to a body portion of at least one cross-shaped active area; and a buried word line positioned substantially orthogonally to the buried digit line and electrically coupled with the polysilicon gate area.

31. The electronic system of claim 30, wherein the plurality of arm portions comprises four arm portions.

32. The electronic system of claim 30, wherein the cross-shaped active area is a discrete active area isolated from other discrete active areas.

33. The electronic system of claim 30, wherein the at least one capacitor comprises a stacked container-style capacitor.

34. The electronic system of claim 33, wherein the polysilicon gate area comprises a polysilicon body portion and four arms forming gates.

35. The electronic system of claim 30, wherein the at least one capacitor comprises a trench-style capacitor.

36. The electronic system of claim 35, wherein the polysilicon gate area comprises a substantially continuous polysilicon structure.

37. The electronic system of claim 30, wherein the buried digit line and the body portion of the cross-shaped active area topologically overlap.

38. The electronic system of claim 30, wherein each cross-shaped active area comprises an area of nine features (F) squared.

39. The electronic system of claim 31, wherein each arm portion of the plurality of arm portions comprises an area of two features (F) squared.

40. The electronic system of claim 39, wherein the body portion comprises an area of one feature (F) squared.

41. The electronic system of claim 30, wherein each cross-shaped active area is offset from another cross-shaped active area by a distance of four features (F) in a first direction and two features (F) in a second, orthogonal direction.

42. The electronic system of claim 30, wherein the at least one capacitor comprises four capacitors.

43. The electronic system of claim 42, wherein each of the four capacitors is associated with a different active area of the plurality of cross-shaped active areas.

44. The electronic system of claim 30, further comprising a digit line contact for electrically coupling the buried digit line to the body portion of the at least one cross-shaped active area, the digit line contact shared by four DRAM cells.

* * * * *